United States Patent
Horii et al.

(10) Patent No.: US 8,435,905 B2
(45) Date of Patent: May 7, 2013

(54) MANUFACTURING METHOD OF SEMICONDUCTOR DEVICE, AND SUBSTRATE PROCESSING APPARATUS

(75) Inventors: Sadayoshi Horii, Toyama (JP); Hideharu Itatani, Toyama (JP); Kazuhiro Harada, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 292 days.

(21) Appl. No.: 11/921,936

(22) PCT Filed: Jun. 13, 2006

(86) PCT No.: PCT/JP2006/311853
§ 371 (c)(1),
(2), (4) Date: Feb. 11, 2008

(87) PCT Pub. No.: WO2006/134930
PCT Pub. Date: Dec. 21, 2006

(65) Prior Publication Data
US 2009/0035947 A1 Feb. 5, 2009

(30) Foreign Application Priority Data
Jun. 13, 2005 (JP) .................. 2005-172405

(51) Int. Cl.
*H01L 21/31* (2006.01)
*H01L 21/469* (2006.01)

(52) U.S. Cl.
USPC ............... 438/765; 438/3; 438/240; 438/287; 438/253; 438/396; 438/400; 438/591; 438/597; 438/680; 438/681; 438/685; 438/686; 438/687; 438/761; 438/763; 427/96.8; 427/97.7; 427/124; 427/250; 427/255.28; 427/255.394; 427/301; 427/331; 427/576; 427/585

(58) Field of Classification Search .......... None
See application file for complete search history.

(56) References Cited

U.S. PATENT DOCUMENTS

| | | | |
|---|---|---|---|
| 2002/0048635 A1 * | 4/2002 | Kim et al. | 427/331 |
| 2003/0003230 A1 | 1/2003 | Kim et al. | |
| 2004/0087143 A1 | 5/2004 | Norman et al. | |
| 2005/0250341 A1 * | 11/2005 | Itatani et al. | 438/763 |
| 2006/0177601 A1 * | 8/2006 | Park et al. | 427/576 |

FOREIGN PATENT DOCUMENTS

| | | |
|---|---|---|
| JP | A 2000-160342 | 6/2000 |
| JP | A 2004-156141 | 6/2004 |
| WO | WO 2004/008513 A1 | 1/2004 |

OTHER PUBLICATIONS

Ligand definition—http://dictionary.reference.com/browse/ligand.*
Korean Office Action issued Oct. 27, 2009 for Korean Application No. 10-2007-7030296 (with translation).

* cited by examiner

*Primary Examiner* — Julio J Maldonado
*Assistant Examiner* — Shantanu C Pathak
(74) *Attorney, Agent, or Firm* — Oliff & Berridge, PLC

(57) ABSTRACT

The present invention provides a manufacturing method of a semiconductor device that has a rapid film formation rate and high productivity, and to provide a substrate processing apparatus.

The method comprises the steps of loading a substrate into a processing chamber; forming a thin film having a desired thickness on the substrate by setting as one cycle the step of supplying into the processing chamber adsorption auxiliary gas for aiding an adsorption of a source gas vaporized from a liquid source on the substrate and causing this adsorption auxiliary gas to be adsorbed on the substrate, the step of supplying the source gas into the processing chamber, causing the source gas to react with the adsorption auxiliary gas on the substrate, and causing this source gas to be adsorbed on the substrate, and the step of supplying a reaction gas into the processing chamber and causing this reaction gas to react with the source gas adsorbed on the substrate, and repeating this cycle a plurality of times; and unloading the substrate provided with the thin film from the inside of the processing chamber.

13 Claims, 8 Drawing Sheets

MANUFACTURING METHOD OF SEMICONDUCTOR DEVICE, AND SUBSTRATE PROCESSING APPARATUS

TECHNICAL FIELD

The present invention relates to a manufacturing method of a semiconductor device for forming a thin film, e.g., an electroconductive metal film or another thin film on a substrate, and to a substrate processing apparatus.

BACKGROUND ART

A DRAM capacitor is taken as an example of a semiconductor device provided with a thin film such as an electroconductive metal film.

Research has been actively carried out to metallize a lower electrode film or an upper electrode film in order to assure accumulated charge capacity in the DRAM capacitor, with a fine pattern of the DRAM capacitor. For example, noble metals Ru, Pt, Ir or oxides thereof are candidates for the material of the lower electrode film or the upper electrode film. Also, TiN, TaN, and the like are used as the material of the barrier metal film.

A cylinder shape having a high aspect ratio is mainly used as the shape of a capacitor electrode. For this reason, all films including the lower electrode film, the upper electrode film, and the barrier film require excellent step coverage.

In view of the above situation, not a conventional sputtering method but a CVD method, which has excellent step coverage, has been used as a film formation method. Particularly reaction between an organic metallic liquid source, and oxygen containing gas, hydrogen containing gas or nitrogen containing gas is used.

DISCLOSURE OF THE INVENTION

Problem which the Invention is Intended to Solve

In the CVD method described above, a temperature has to be inevitably lowered, to improve the step coverage. However, lowering the temperature involves a problem that lots of carbon and oxygen in the organic liquid source remain in the thin film as impurities, thus deteriorating electrical characteristics of the thin film. In addition, heat treatment after film formation involves a problem that impurity gas elimination occurs, resulting in a separation of a film. Further, regarding several organic liquid sources, incubation time is increased, thus involving a problem that productivity is deteriorated.

Therefore, a so-called ALD (Atomic Layer Deposition) method is used. In this ALD method, the step of supplying to a substrate only a source gas obtained by vaporizing the organic liquid source and making this source gas adsorbed on the substrate, then supplying to the substrate reactive gas such as hydrogen or ammonia gas excited by plasma, and forming the thin film, is set as one cycle, and by repeating this cycle a plurality of times, the thin film of a desired thickness is formed. However, in the ALD method, there is a problem that a high film formation rate is hardly obtained and the productivity is easily deteriorated.

An object of the present invention is to provide a manufacturing method of a semiconductor device having a high film formation rate and high productivity, and to provide a substrate processing apparatus.

Means of Solving the Problems

According to an aspect of the present invention, a manufacturing method of a semiconductor device is provided that has the steps of loading a substrate into a processing chamber; forming a thin film having a desired thickness on the substrate by setting as one cycle the step of supplying into the processing chamber adsorption auxiliary gas for aiding an adsorption of a source gas vaporized from a liquid source on the substrate and causing this adsorption auxiliary gas to be adsorbed on the substrate, the step of supplying the source gas into the processing chamber, causing this source gas to react with the adsorption auxiliary gas on the substrate, and causing the source gas to be adsorbed on the substrate, and the step of supplying a reaction gas into the processing chamber and causing this reaction gas to react with the source gas adsorbed on the substrate, and repeating this cycle a plurality of times; and unloading the substrate provided with the thin film from the inside of the processing chamber.

According to another aspect of the present invention, a manufacturing method of the semiconductor device is provided that has the steps of loading a substrate into a processing chamber; forming a thin film having a desired thickness on the substrate by setting as one cycle the step of supplying into the processing chamber a ligand-decomposing gas that decomposes the ligand of a source gas vaporized from a liquid source, and causing this ligand-decomposing gas to be adsorbed on the substrate, the step of supplying the source gas into the processing chamber, causing this source gas to react with the ligand-decomposing gas on the substrate, and causing this source gas to be adsorbed on the substrate, and the step of supplying a reaction gas into the processing chamber, and causing this reaction gas to react with the source gas adsorbed on the substrate, and repeating this cycle a plurality of times; and unloading the substrate provided with the thin film from the inside of the processing chamber.

According to another aspect of the present invention, a manufacturing method of the semiconductor device is provided that has the steps of loading a substrate into a processing chamber; forming a thin film having a desired thickness on the substrate by setting as one cycle the step of supplying into the processing chamber a gas containing oxygen atoms, and causing this gas to be adsorbed on the substrate, the step of supplying into the processing chamber a source gas vaporized from a liquid source, causing the source gas to react with the containing oxygen atoms on the substrate, and causing the source gas to be adsorbed on the substrate, and the step of supplying into the processing chamber a reaction gas not containing oxygen atoms and causing this reaction gas to react with the source gas adsorbed on the substrate, and repeating this cycle a plurality of times; and unloading the substrate provided with the thin film from the inside of the processing chamber.

According to another aspect of the present invention, a manufacturing method of the semiconductor device is provided including the steps of loading a substrate into a processing chamber; forming a thin film having a desired thickness as an initial film on the substrate by setting as one cycle the step of supplying into the processing chamber a source gas vaporized from a liquid source and causing this source gas to be adsorbed on the substrate, the step of supplying a reaction gas to react with the source gas adsorbed on the substrate, and repeating this cycle a plurality of times, forming a thin film having a desired thickness on said thin film having the desired thickness formed in said initial film forming step, by setting as one cycle the step of supplying into the processing chamber an adsorption auxiliary gas for aiding adsorption of the source gas on the substrate and causing this adsorption auxiliary gas to be adsorbed on the substrate, the step of supplying the source gas into the processing chamber, and causing this source gas to react with the adsorption auxiliary gas on the substrate, and the step of supplying the reaction gas into the processing chamber and causing this reaction gas to react with the source gas adsorbed on the substrate, and repeating this cycle a plurality of times; and unloading the substrate provided with the thin film from the inside of the processing chamber.

According to another aspect of the present invention, a substrate processing apparatus has a processing chamber for processing a substrate; a source gas supply line for supplying into the processing chamber a source gas vaporized from a liquid source; a reaction gas supply line for supplying into the processing chamber a reaction gas that reacts with the source gas; an adsorption auxiliary gas supply line for supplying into the processing chamber an adsorption auxiliary gas for aiding adsorption on the substrate of the source gas; and a controller for carrying out control for forming a thin film having a desired thickness on the substrate by setting as one cycle the step of supplying the adsorption auxiliary gas into the processing chamber and causing this adsorption auxiliary gas to be adsorbed on the substrate, the step of supplying the source gas into the processing chamber and causing this source gas to react with the adsorption auxiliary gas on the substrate and be adsorbed on the substrate, the step of supplying the reaction gas into the processing chamber and causing this reaction gas to react with the source gas adsorbed on the substrate, and repeating this cycle a plurality of times.

Effect of the Invention

According to the present invention, a manufacturing method of a semiconductor device having a high film formation rate and high productivity, and a substrate processing apparatus can be provided.

BEST MODE FOR CARRYING OUT THE INVENTION (A) Film Formation Mechanism According to an Embodiment of the Present Invention As described above, in a conventional ALD method, the step of supplying a source gas to a substrate and making this source gas adsorbed on the substrate, then supplying a reactive gas to the substrate, and forming a thin film, is set as one cycle, and by repeating this cycle a plurality of times, a thin film having a desired thickness is formed. However, inventors of the present invention found a problem involved in the conventional ALD method. Namely, when particularly hydrogen gas or ammonia gas excited by plasma is used as the reactive gas, a surface of the substrate is cleaned by the reactive gas in each cycle, thus making it difficult to allow the source gas to be adsorbed on the surface of the substrate (the surface of the generated thin film), and a film formation rate is lowered. Based on such a knowledge, the inventors of the present invention achieves and completes the present invention.

Before explaining examples of the present invention, a substrate processing step as one step of a manufacturing method of a semiconductor device according to an embodiment of the present invention and its film formation mechanism will be explained by using FIG. 5. In the reference diagrams, FIG. 5 is a diagram that exemplifies the film formation mechanism when an embodiment of the present invention is implemented, wherein (a) shows a state in which adsorption auxiliary gas for aiding adsorption of a source gas is supplied and adsorbed on the substrate surface; (b) shows a state in which source gas is supplied to the substrate surface, reacted with adsorption auxiliary gas, and adsorbed onto the substrate; (c) shows a state in which reaction gas is supplied to the substrate surface and reacted with the source gas; and (d) shows the state of the substrate surface after a single cycle has been completed.

(1) Step of Loading a Substrate

First, a substrate is loaded into a processing chamber. The processing chamber here refers to an air-tightly closed vessel in which the substrate is stored inside, so that an inside of the processing chamber can be filled with each kind of gases as will be described later, with the substrate stored therein, or the gas can be exhausted. The surface of the substrate stored in the processing chamber can be heated to a prescribed temperature using a heater or the like that is disposed inside the processing chamber. In an embodiment of the present invention, a silicon substrate 1 in which, e.g. a $SiO_2$ film is formed on the surface is used as the substrate to be processed.

(2) Step of Supplying Adsorption Auxiliary Gas for Aiding Adsorption on the Substrate of the Source Gas.

Next, adsorption auxiliary gas for aiding adsorption of source gas is supplied into the processing chamber in which the substrate is loaded. The inside of the processing chamber is exhausted and is replaced with an inert gas such as nitrogen gas, prior to supplying adsorption auxiliary gas. Also, the pressure inside the processing chamber is adjusted to a prescribed pressure, and the temperature of the substrate is increased to a prescribed temperature.

Here, the source gas is gas obtained by vaporizing the liquid source. The liquid source may be suitably selected from various types in accordance with a purpose of use. For example, the liquid source containing Ru, $RuO_2$, Pt, Ir, $IrO_2$, or the like can be used for the lower electrode film or the upper electrode film in the case that a DRAM capacitor is to be manufactured. Also, liquid source containing TiN, TaN, or the like can be used for the barrier metal film.

Specifically, $Ru(C_2H_5C_5H_4)_2$ (bisethylcyclopentadienyl ruthenium), $Ru(C_5H_5)(C_4H_9C_5H_4)$ (butyl ruthenocene), $Ru[CH_3COCHCO(CH_2)_3CH_3]_3$ (tris 2,4-octanedionate ruthenium), $Ru(C_2H_5C_5H_4)((CH_3)C_5H_5)$ (2,4-dimethyl pentadienyl ethyl cyclopentadienyl ruthenium), $Ru(C_7H_8)(C_7H_{11}O_2)$, and other organic liquid metals may be used as the liquid source for the lower electrode film or upper electrode film.

Also, organic liquid metal such as $Ti[(OCH(CH_3)_2)]_4$, $Ti(OCH_2CH_3)_4$, $Ti[(N(CH_3)_2]_4$, $Ti[N(CH_3CH_2)_2]_4$, $Ta(C_2H_5O)_5$ can be used as the liquid source for the barrier metal film.

In an embodiment of the present invention, gas (hereinafter abbreviated as DER gas) obtained by vaporizing $Ru(C_2H_5C_5H_4)((CH_3)C_5H_5)$ is used as the source gas. The gas molecules of the DER gas are composed of ruthenium (Ru) atoms, and ligand h1 ($C_2H_5C_5H_4$) and ligand h2 ($(CH_3)C_5H_5$) bonded to the ruthenium (Ru) atoms.

Meanwhile, ligand-decomposing gas that decomposes the ligand of the source gas can be used as the adsorption auxiliary gas. The gas containing oxygen atoms (O) such as Oxygen gas ($O_2$), water vapor ($H_2O$), hydroxyl radicals (OH*), can be used as the gas that decomposes the ligand of the source gas. In an embodiment of the present invention, oxygen gas is used as the adsorption auxiliary gas.

As described above, when the oxygen gas is supplied into the processing chamber, as shown in FIG. 5(a), an oxygen atom (O) or an oxygen molecule ($O_2$) is set in a state of being bonded to a dangling bond of the $SiO_2$ film on a silicon substrate 1 or being physically adsorbed on the surface of the $SiO_2$ film.

(3) Step of Supplying Source Gas

Next, DER gas is supplied as source gas into the processing chamber. Prior to supplying the DER gas, the inside of the processing chamber is evacuated and residual gas is removed or residual gas in the processing chamber is replaced with the inert gas such as nitrogen gas.

When DER gas is supplied into the processing chamber, the DER gas molecules readily react with oxygen atoms or oxygen molecules absorbed on the $SiO_2$ film (also simply referred to as silicon substrate 1 hereafter, including the film formed on the surface) formed on the surface of the silicon substrate 1, and the DER gas molecules decompose and produce the state shown in FIG. 5(b).

Specifically, at least either one of the ligands h1 and h2 is separated from the ruthenium (Ru) of the DER molecules, by the oxygen atoms or the oxygen molecules adsorbed on the silicon substrate 1. The DER gas molecules from which one of the ligands has been separated and the remaining ruthenium (Ru) atoms from which the two ligands have been separated are chemically adsorbed on the $SiO_2$ film on the silicon substrate 1.

The ligands h1 and h2 separated from the ruthenium (Ru) atoms furthermore react with oxygen and decompose, generating a volatile substance such as $H_2O$, $CO_2$. Carbon (C) generated when the ligand h1 or h2 is separated from the ruthenium (Ru) atoms is adsorbed as a byproduct onto the silicon substrate 1. Carbon (C) generated by a decomposition of the ligands h1 or h2 separated from the ruthenium atom (Ru), is adsorbed on the silicon substrate 1 as a byproduct.

DER gas is more unstable and decomposes more readily than $Ru(C_2H_5C_5H_4)_2$ (bisethylcyclopentadienyl ruthenium) gas (hereinafter abbreviated as $Ru(EtCp)_2$ gas) in the source gas obtained by vaporizing the aforementioned liquid source. Specifically, the ligands are easily separated from the ruthenium (Ru), and the source gas or the ruthenium (Ru), with one of the ligands separated, is easily adsorbed on the substrate. In other words, DER gas has greater reactivity than $Ru(EtCp)_2$ gas, and a rapid film formation rate can be easily achieved particularly in a case that the DER gas is used as the source gas in ALD film formation.

(4) Step of Supplying Reaction Gas

Next, reaction gas is supplied into the processing chamber. Prior to supplying reaction gas, the inside of the processing chamber is exhausted and residual gas is removed or the residual gas inside the processing chamber is replaced with the inert gas such as nitrogen gas.

Here, the reaction gas refers to the gas that reacts with the DER gas adsorbed onto the silicon substrate 1, generates a thin film, and cleans the surface of the silicon substrate 1. Cleaning refers to the removal of oxygen adsorbed on the silicon substrate 1, a replacement of the oxygen adsorbed on the silicon substrate 1 with a gas other than oxygen, the removal of carbon adsorbed on the silicon substrate 1, or the removal of the source gas itself adsorbed on the silicon substrate 1. Here, the removal of the source gas itself adsorbed on the silicon substrate 1 refers to the removal of the DER gas molecule from the silicon substrate 1, the DER gas molecule being adsorbed on the silicon substrate 1 without decomposing.

As the reaction gas, it is possible to use the gas (abbreviated as the gas containing hydrogen hereunder) not containing oxygen atom (O) but containing hydrogen atom (H), and use the gas obtained by activating the gas (abbreviated as nitrogen containing gas hereunder) containing nitrogen atom (N) by plasma. The type of hydrogen-containing gas and nitrogen-containing gas can be suitably selected in accordance with the type of source gas, and, for example, hydrogen gas ($H_2$) or ammonia gas ($NH_3$) can be used. Particularly, it appears that a hydrogen containing substance such as hydrogen radical (H*), hydrogen ($H_2$), and atomic hydrogen (H) considerably contributes to the aforementioned cleaning action.

It is also effective in some cases that a lifetime of the hydrogen radical is extended by adding argon to the hydrogen containing gas activated by plasma. Also, argon gas may be used as reaction gas when the source gas is decomposed only by plasma excitation.

A mixed gas of plasma-excited ammonia gas and argon is used as the reaction gas in an embodiment of the present invention.

The surface of the silicon substrate 1 is cleaned by reaction gas when the reaction gas is supplied, as shown in FIG. 5(c). Namely, carbon (C) adsorbed on the silicon substrate 1 as a byproduct reacts with active hydrogen contained in the reaction gas, and is converted to a volatile substance such as methane ($CH_4$) and desorbed. Also, regarding a part of the DER gas molecule in a state of separating one of the ligands adsorbed on the silicon substrate 1, the remaining ligand is also separated and this part of the DER gas molecule becomes ruthenium (Ru) atom, resulting in a state that only the DER gas molecule in a state of not separating the remaining ligand and ruthenium atom Ru are adsorbed on the $SiO_2$ film on the silicon substrate 1. By this cleaning action, it is possible to prevent impurities from remaining in the formed ruthenium thin film, improve an electrical characteristic of the ruthenium thin film and improve adhesiveness of the ruthenium thin film to the silicon substrate 1.

After the reaction gas is supplied, the inside of the processing chamber is exhausted or the atmosphere in the processing chamber is replaced with the inert gas such as nitrogen gas. FIG. 5(d) shows the state of the ruthenium thin film generated in the steps of (2) through (4) described above. In this state, not only the ruthenium atom Ru, but also the DER gas molecule in a state of not separating one of the ligands is slightly adsorbed on the silicon substrate 1. However, the ligand that remains unseparated is separated by reaction with the oxygen gas supplied in the step of (2) in the following cycle. Thus, by sequentially supplying oxygen gas, DER gas, and reaction gas to the processing chamber, the reaction of the gas in the processing chamber can be suppressed, and a film can be formed on the silicon substrate 1, with excellent step coverage.

(5) Repeating Step

The aforementioned steps (2) to (4) are set as one cycle, and this cycle is repeated a plurality of times, to form the ruthenium thin film of a desired film thickness on the silicon substrate 1. In the description above, the act of forming the ruthenium thin film in one cycle is expressed as "generation," and the act of forming the ruthenium thin film of a desired thickness by repeating this cycle a plurality of times is expressed as "formation."

(6) Step of Unloading a Substrate

After the ruthenium thin film of a desired film thickness is formed, the silicon substrate 1 is unloaded from the processing chamber, and the substrate processing step is completed.

(B) Film Formation Mechanism by Conventional ALD Method

Next, the substrate processing step and film formation mechanism according to conventional ALD method will be described with reference to FIG. 6 in comparison with an embodiment of the present invention.

As a reference figure, FIG. 6 is a view exemplifying a film formation mechanism when a conventional ALD method is implemented, wherein (a) shows a state in which the source gas is supplied and adsorbed on the substrate surface; (b) shows a state in which the reaction gas is supplied to the substrate surface and reacted with the source gas to form a film; and (c) shows the state of a thin film generated on the substrate surface in one cycle.

The conventional ALD method is different from the embodiment of the present invention in the point that the gas for aiding adsorption on the substrate of the source gas is not supplied into the processing chamber.

(1) Step of Supplying Source Gas

First, the silicon substrate 1 is stored in the processing chamber and the DER gas, being the source gas, is supplied into the processing chamber. Note that before supplying the DER gas, the inside of the processing chamber is exhausted or the atmosphere in the processing chamber is replaced with the inert gas such as nitrogen gas.

By supplying the DER gas into the processing chamber, as shown in FIG. 6(a), the DER gas molecule is physically adsorbed on the $SiO_2$ film on the silicon substrate 1 without decomposition.

(2) Step of Supplying Reaction Gas

Next, the processing chamber is exhausted and the reaction gas is supplied into the processing chamber. Note that before supplying the reaction gas, the residual gas in the processing chamber is exhausted or the residual gas in the processing chamber is replaced with the inert gas such as nitrogen gas.

When the reaction gas is supplied into the processing chamber, the surface of the silicon substrate 1 is cleaned by the reaction gas in the state shown in FIG. 6(b). Namely, most of the DER gas molecules physically adsorbed on the $SiO_2$ film are removed by the cleaning action by active hydrogen or nitrogen contained in plasma-excited ammonia gas. Also, when oxygen is adsorbed on the silicon substrate 1, the oxygen is removed or replaced with a gas other than oxygen. Only a small amount of DER gas molecules is decomposed and a very small amount of ruthenium (Ru) atoms is chemically adsorbed on the $SiO_2$ film on the silicon substrate 1. In this case, the ligands h1 and h2 are bonded to hydrogen to generate a volatile substance.

Next, when the inside of the processing chamber is exhausted, as shown in FIG. 6(c), the surface of the silicon substrate 1 is set in a state of being cleaned, with only a slight amount of ruthenium atom Ru chemically adsorbed on the silicon substrate 1.

(3) Repeating Step

Thereafter, the aforementioned steps (1) to (3) are set as one cycle, and this cycle is repeated a plurality of times, to form the ruthenium thin film of a desired film thickness on the silicon substrate 1.

(4) The Step of Unloading the Substrate

After the ruthenium thin film of a desired film thickness is formed, the silicon substrate 1 is unloaded from the processing chamber and the substrate processing step is completed.

(C) Effect of an Embodiment of the Present Invention

As described above, according to an embodiment of the present invention, oxygen gas is previously adsorbed on the surface of the silicon substrate 1 before supplying the DER gas in each cycle. Therefore, when the DER gas is supplied to the silicon substrate 1, the ligands h1 and h2 are easily decomposed from the DER gas molecules, and the DER gas molecule in a state of separating one of the ligands and the ruthenium atom Ru are easily chemically adsorbed on the silicon substrate 1. Also, the occurrence of incubation time can be reduced because a surface reaction occurs with the DER gas adsorbed on the surface of the silicon substrate 1 in an initial stage of the film formation.

Meanwhile, in the conventional ALD method, oxygen gas is not present on the surface of the silicon substrate 1 when the DER gas is supplied thereto. Therefore, the DER gas molecule is hardly decomposed, and the DER gas molecule and the ruthenium atom Ru are hardly chemically adsorbed on the silicon substrate 1. In addition, when the reaction gas is supplied to the surface of the silicon substrate 1, most of the DER gas molecules physically adsorbed on the silicon substrate 1 are removed. Also, by the cleaning action on the surface of the substrate by the reaction gas, even if the DER gas is supplied after supplying the reaction gas, the ligands of the DER gas are not separated, thus making it further difficult to allow a chemical adsorption of the DER gas molecule and the ruthenium atom Ru on the silicon substrate 1.

FIG. 7 is a diagram showing the difference in the film formation rates between conventional ALD and an embodiment of the present invention the difference in the thickness of the ruthenium films that is formed in the same length of time. FIG. 7 is a view showing a difference in film formation rate between the conventional ALD method and the embodiment of the present invention, by a difference in the film thickness of the ruthenium film formed in the same length of time. According to FIG. 7, a growing rate of the embodiment of the present invention shown in (b) is faster than that of the conventional ALD method shown in (a), and it is found that the ruthenium Ru film can be formed on the silicon substrate 1 thicker than that of the conventional ALD method in the same length of time.

As described above, according to the embodiment of the present invention, the film formation rate can be accelerated and an improvement of productivity can be achieved, in comparison with the conventional A/D method. Such an effect is particularly exhibited when the reaction gas does not contain oxygen and the surface of the substrate is cleaned.

EXAMPLES

Examples of the present invention will be described below with reference to FIGS. 1 through 4 and FIG. 8. As reference figures, each of FIGS. 1 through 3 shows a substrate processing step as one step of the manufacturing step of the semiconductor device according to examples 1 through 3 described below. FIG. 4 shows a configuration example of the substrate processing apparatus according to an embodiment of the present invention used in common in each of the examples 1 through 3. Also, FIG. 8 is a cross-sectional view of the DRAM capacitor portion provided with a lower electrode film and upper electrode film formed in examples 1 through 3.

Example 1

In example 1, by using the manufacturing method of the semiconductor device according to the present invention, the method of forming the lower electrode film and the upper electrode film of a DRAM capacitor will be described.

(1) DRAM Capacitor Structure

First, the structure of the DRAM capacitor and the manufacturing method thereof will be described with reference to FIG. 8.

Initially, an interlayer insulation film 100 composed of an insulator such as $SiO_2$ is formed on the silicon substrate 1. A contact hole 107 is opened so as to pass through the interlayer insulation film 100.

Next, a contact plug 101 for connection to the silicon substrate 1 is formed inside the contact hole 107 thus opened. Polysilicon may be used as the material of the contact plug 101, and tungsten may also be used.

A barrier metal film 102 is then formed so as to embed an upper space of the contact plug 101. TiN and TaN are given as examples of the material of the barrier metal film 102. The barrier metal film 102 prevents an oxidant and a material constituting an electrode from dispersing in the contact plug 101.

An interlayer insulation film 103 is subsequently formed on the entire surface of the interlayer insulation film 100 and the barrier metal film 102. A contact hole 108 is thereafter opened so as to pass through the interlayer insulation film 103.

Next, the manufacturing method of a the semiconductor device according to the present invention is used to form a lower electrode film 104 in the contact hole 108 and on the entire surface of the interlayer insulation film 103. The method of forming the lower electrode film 104 is described in section (3).

The lower electrode film 104 on the interlayer insulation film 103 is removed, with the lower electrode film 104 in the contact hole 108 remained as it is. The interior of the lower electrode film 104 thus remained in the contact hole 108 is then etched so that the lower electrode film 104 is formed in a cylinder shape.

Next, a capacitive insulating film 105 is formed using a prescribed manufacturing method on the entire surface of the lower electrode film 104 and interlayer insulation film 103.

Lastly, manufacturing method of the semiconductor device according to the present invention is used to form an upper electrode film 106 on the entire surface of the capacitive insulating film 105 and a manufacture of a capacitor shown in FIG. 8 is completed. The method of forming an upper electrode film 106 is also described in section (3).

(2) Structure of the Substrate Processing Apparatus

Next, the structure of the substrate processing apparatus according to an embodiment of the present invention used in example 1 will be described with reference to FIG. 4. The substrate processing apparatus exemplified in FIG. 4 is not limited to the implementation of the film formation method by the ALD method such as that described in example 1, and can also be applied to the film formation method by the CVD method.

The substrate processing apparatus is provided with a processing chamber 5 for loading the silicon substrate 1 thereinto and forming a thin film therein. The processing chamber 5 is formed inside a processing container 5a. A side surface portion of the processing chamber 5 is provided with a gate valve 2 that opens and closes a substrate loading and unloading port 2a. A transport robot (not shown) can transport the silicon substrate 1 into and out of the processing chamber 5 via the substrate loading and unloading port 2a that has been opened by opening the gate valve 2.

A susceptor 41 for supporting the silicon substrate 1 from under is disposed inside the processing chamber 5. The susceptor 41 is supported by a heater unit 40 from under. The heater unit 40 houses a heater 4 for heating the silicon substrate 1. The heater 4 is controlled by a temperature control device 17, and the silicon substrate 1 on the susceptor 41 can be heated to a prescribed temperature.

The heater unit 40 is elevatably disposed inside the processing chamber 5 by using an elevator mechanism 39 and is rotatably disposed as required. The heater unit 40 lowers to the position indicated by the solid line when the silicon substrate 1 is transported, and a push-up pin 3 that protrudes from the surface of the susceptor 41 support the silicon substrate 1. Also, the heater unit 40 rises to the position shown by the dotted line when a film is formed on the silicon substrate 1, and the susceptor 41 supports the silicon substrate 1 because the push-up pin 3 is indented from the surface of the susceptor 41.

An exhaust tube 9 for exhausting the processing chamber 5 is connected to the bottom surface of the processing chamber 5.

A shower head 27 for supplying gas to the processing chamber 5 is disposed in the upper surface of the processing chamber 5. The shower head 27 is composed of a diffusion plate 7 for diffusing the gas supplied to the shower head 27, a buffer space 28 for dispersing the gas diffused by the diffusion plate 7, and a shower plate 8 for jetting the diffused gas like a shower into the processing chamber 5.

A source gas supply line 15 for supplying source gas into the processing chamber 5 is connected to the upper portion of the shower head 27.

Furthermore, a reaction gas supply line 29 for supplying reaction gas that reacts with the source gas into the processing chamber 5, and an adsorption auxiliary gas supply line 30 for supplying into the processing chamber 5 adsorption auxiliary gas that aids the adsorption of the source gas onto the silicon substrate 1, are connected to the upper portion of the shower head 27 via opening/closing valves 14 and 13, respectively.

The source gas supply line 15 supplies the DER gas as the source gas into the processing chamber 5.

A DER gas tube 31 for supplying the DER gas, a nitrogen gas tube 32 for supplying nitrogen gas as the inert gas, and an ammonia gas tube 33 for supplying ammonia gas as the reaction gas, are connected to the source gas supply line 15 via opening/closing valves 6, 10, and 16, respectively.

A vaporizer 50 for vaporizing DER, which is an organic liquid metal source containing the ruthenium atom as the liquid source, and generating the DER gas is connected to the DER gas tube 31. The nitrogen gas tube 32 supplies nitrogen gas into the source gas supply line 15 when the supply of source gas is stopped, and prevents the reaction gas and the adsorption auxiliary gas from flowing backward (entering) into the source gas supply line 15. The nitrogen gas tube 32 supplies nitrogen gas into the processing chamber 5 and replaces the residual gas in the processing chamber 5 with nitrogen gas. Also, the ammonia gas tube 33 can also supply ammonia gas into the processing chamber 5 via the source gas supply line 15 without plasma excitation.

The reaction gas supply line 29 described above supplies the reaction gas containing the plasma-excited ammonia gas into the processing chamber 5. A plasma generator 11 as a remote plasma excitation unit is connected to the reaction gas supply line 29. A branching tube 34 that branches from the ammonia gas tube 33 described above, and an argon gas tube 35 for supplying argon gas as the gas of plasma ignition are connected to the plasma generator 11. The plasma generator 11 generates plasma by the argon gas supplied from the argon gas tube 35, and ammonia gas supplied from the branching tube 34 is added inside the plasma generator 11 in which plasma is generated, whereby the ammonia gas is plasma-excited and the reaction gas is generated.

A bypass tube 36 is connected to the upstream of an opening/closing valve 14 of the reaction gas supply line 29, i.e., between the opening/closing valve 14 and the plasma generator 11, via an opening/closing valve 12.

The opening/closing valve 12 is opened to allow the reaction gas generated in the plasma generator 11 to escape through the bypass tube 36 to the exhaust tube 9, bypassing the processing chamber 5.

The adsorption auxiliary gas supply line 30 described above supplies into the processing chamber 5 oxygen gas as an adsorption auxiliary gas for aiding the adsorption of source gas on the silicon substrate 1.

An oxygen gas tube 37 for supplying oxygen gas is connected to the adsorption auxiliary gas supply line 30 via an opening/closing valve 23. A nitrogen gas tube 38 for supplying nitrogen gas is connected to the adsorption auxiliary gas supply line 30 via an opening/closing valve 24.

The nitrogen gas tube 38 supplies nitrogen gas when the supply of adsorption auxiliary gas is stopped, and prevents the source gas and the reaction gas from back flowing (entering) into the adsorption auxiliary gas supply line 30. The nitrogen gas tube 38 supplies nitrogen gas into the reaction gas supply line 29 via the adsorption auxiliary gas supply line 30 when the supply of the reaction gas is stopped, and prevents the source gas from entering into the reaction gas supply line 29. The nitrogen gas tube 38 supplies the nitrogen gas into the processing chamber 5 and replaces the gas inside of the processing chamber with the nitrogen gas.

The aforementioned opening/closing valves 6, 10, 16, 12 through 14, 23, and 24 are opened and closed by the controller 60.

Flow rate controllers 21, 20, 19, 25, and 26 for controlling the gas flow rate are disposed in the tubes 32, 33, 35, 37, and 38 described above. A liquid flow rate controller 22 for controlling the flow rate of liquid DER is disposed in the tube 31 described above. Each flow rate controller is controlled by the controller 60.

An exhaust tube conductance controller 18 for adjusting an internal pressure of the processing chamber 5 is disposed in the exhaust tube 9 described above. The exhaust tube conductance controller 18 is controlled by the controller 60. The controller 60 also controls the operation of each component constituting the substrate processing apparatus.

(3) Method of Forming a Ruthenium Film

Next, the method of forming the lower electrode film and the upper electrode film in which the substrate processing apparatus described above is used will be described with reference to FIG. 1. In the description below, the operation of each component constituting the substrate processing apparatus is controlled by the controller 60. The inside of the processing chamber 5 is filled with nitrogen gas, and the atmosphere inside processing chamber 5 is replaced with the inert gas such as nitrogen, before loading the silicon substrate 1 into the processing chamber 5.

First, the silicon substrate 1 with the $SiO_2$ film formed on the surface, is loaded into the aforementioned processing chamber 5, the silicon substrate 1 is placed on a susceptor 41 by elevating the heater unit 40, and the silicon substrate 1 is elevated to a film formation position. By closing the opening/closing valves 6, 10, 16, 14, and 23 and opening the opening/closing valves 24 and 13, the inside of the processing chamber 5 is exhausted by the exhaust tube 9 while supplying the nitrogen gas into the processing chamber 5, thereby filling the inside of the processing chamber 5 with the nitrogen gas. Then, the silicon substrate 1 is heated by the heater 4 to a prescribed temperature, and the pressure inside the processing chamber 5 is stabilized at a desired value (START). Specifically, the surface temperature of the silicon substrate 1 is set to 200 to 350° C. and the pressure inside the processing chamber is set to 0.1 to several tens of Torrs (13.3 Pa to several thousand pascals).

Next, by closing the opening/closing valve 24 and opening the opening/closing valve 23, the oxygen gas inside of the processing chamber 5 is exhausted from the exhaust tube 9 while supplying it into the processing chamber 5 through a diffusion plate 7 and a shower plate 8, the oxygen gas being the gas for aiding the adsorption of the source gas on the silicon substrate 1 (Step 1). Specifically, the flow rate of the oxygen gas is set to 1 to 1,000 sccm, and the supply time per one cycle is set to 1 to 60 seconds.

Subsequently, by opening the opening/closing valve 23, and opening the opening/closing valve 24, the residual gas inside of the processing chamber 5 is further exhausted by using the exhaust tube 9 while supplying the nitrogen gas into the processing chamber 5, thereby replacing the atmosphere in the processing chamber 5 with the nitrogen gas (Step 2).

Next, by closing the opening/closing valve 13 and opening the opening/closing valve 6, the inside of the processing chamber 5 is exhausted by the exhaust tube 9 while supplying the DER gas as the source gas into the processing chamber 5 through the diffusion plate 7 and the shower plate 8 (Step 3). Specifically, the flow rate of DER is set to 0.01 to 0.2 g/minutes, and the supply time per one cycle is set to 1 to 60 seconds. As a result, the DER gas molecule reacts with the oxygen gas adsorbed on the silicon substrate 1 and decomposed, and the ruthenium (Ru) atom and the DER gas molecule in which one of the ligands is removed are chemically adsorbed on the $SiO_2$ film on the silicon substrate 1.

Subsequently, by closing the opening/closing valve 6 and opening the opening/closing valve 10. The residual gas inside of the processing chamber 5 is further exhausted by using the exhaust tube 9 while supplying the nitrogen gas into the processing chamber 5, thereby replacing the atmosphere inside of the processing chamber 5 with the nitrogen gas (Step 4).

In the meantime, by opening the opening/closing valve 12, the processing chamber 5 is bypassed and the inside of the processing chamber 5 is exhausted, while supplying the argon gas and the ammonia gas to the plasma generator 11 and exciting these gases, thereby generating the reaction gas. Also in the meantime, by opening the opening/closing valve 13, the nitrogen gas is supplied into the reaction gas supply line 29 via the adsorption auxiliary gas supply line 30, and the DER gas is prevented from flowing back (entering) into the plasma generator 11.

Next, by closing the opening/closing valves 10, 12, and 13 and opening the opening/closing valve 14, the reaction gas inside of the processing chamber 5 is exhausted by the exhaust tube 9 while supplying it into the processing chamber 5 (Step 5). Specifically for example, the flow rate of the reaction gas is set to 100 to 2,000 sccm, and the supply time per one cycle is set to 1 to 60 seconds. As a result, the surface of the silicon substrate 1 is cleaned by the reaction gas. Also, regarding a part of the DER gas molecule in a state of separating one of the ligands adsorbed on the silicon substrate 1, the remaining ligand is also separated.

Subsequently, by closing the opening/closing valve 14 and opening the opening/closing valve 13, the residual gas inside of the processing chamber 5 is exhausted by using the exhaust tube 9 while supplying the nitrogen gas into the processing chamber, thereby replacing the atmosphere inside of the processing chamber with the nitrogen gas (Step 6).

Then, by setting the steps 1 to 6 as one cycle, this cycle is repeated a plurality of times until the ruthenium thin film of a desired film thickness is formed on the silicon substrate 1. The silicon substrate 1 on which a thin film is formed is thereafter unloaded from the processing chamber 5, and the substrate processing step is completed (END).

For example, the thickness of the ruthenium thin film generated per one cycle is 0.01 to 0.1 nm, and therefore a total film thickness under 50 to 1000 cycles is 5 to 15 nm.

Example 2

In the example 2 as well, By using the manufacturing method of the semiconductor device according to the present invention, the method of forming the lower electrode film and the upper electrode film of the DRAM capacitor will be explained.

In the example 2, although the film is formed by the same method as that of the example 1 only in the initial stage of film formation, the example 2 is different from the example 1 in the point that the film is formed by using a thermal CVD method in which the DER gas and the oxygen gas are simultaneously supplied, from the halfway point. The other conditions are substantially the same as example 1.

(1) Structure of the Dram Capacitor and Structure of the Substrate Processing Apparatus These structures are the same as example 1.

(2) Method of Forming a Ruthenium Film

The method of forming the lower electrode film and the upper electrode film in the example 2 will be described with reference to FIG. 2. In the description below, the operation of each component constituting the substrate processing apparatus is controlled by the controller 60. Before the silicon substrate 1 is loaded into the processing chamber 5, the inside of the processing chamber 5 is previously filled with the nitrogen gas, and the atmosphere in the processing chamber 5 is replaced with the inert gas such as nitrogen.

First, the silicon substrate 1 on, with the $SiO_2$ film formed on the surface, is loaded into the aforementioned processing chamber 5, the silicon substrate 1 is placed on the susceptor 41 by elevating the heater unit 40, and the silicon substrate 1 is elevated to the film formation position. Then, by closing the opening/closing valves 6, 10, 16, 14, and 23 and opening the opening/closing valves 24 and 13, the residual gas inside of the processing chamber 5 is exhausted by the exhaust tube 9 while supplying the nitrogen gas into the processing chamber 5.

Then, the silicon substrate 1 is heated by the heater 4 to a prescribed temperature, and the pressure inside the processing chamber 5 is stabilized at a desired value (START). Specifically, the surface temperature of the silicon substrate 1 is set to 200 to 350° C., and the pressure inside the processing chamber is set to 0.1 to several tens of Torrs (13.3 Pa to several thousand pascals).

Thereafter, the steps 1 to 6 in the example 1 is set as one cycle, and by repeating this cycle a plurality of times, the ruthenium film of a desired film thickness is formed on the silicon substrate 1. The number of cycles at this time is set smaller than a case of the example 1, and for example, is set to 20 to 100 times. Other specific condition is the same as that of the example 1. As a result, for example, the film thickness of the ruthenium film per one cycle is 0.01 to 0.1 nm and the film thickness after repeating the cycle a plurality of times is 1 to 5 nm, in the same way as the example 1, when the cycle is repeated the prescribed number of times.

Thereafter, by closing the opening/closing valve 24 and opening the opening/closing valves 6 and 23 the DER gas and the oxygen gas are exhausted from the exhaust tube 9 while supplying them simultaneously into the processing chamber 5. Then, the thin film of a desired film thickness is further formed on the ruthenium thin film formed in the aforementioned step by the thermal CVD method (Thermal CVD step). From the viewpoint of productivity and cost, the thermal CVD step is preferably carried out in the same reaction chamber at the same temperature as the steps described above. In example 2 as well, the thermal CVD is carried out inside the same processing chamber 5 as the steps described above, and the temperature of the substrate and the pressure in the processing chamber are set under the same condition as that of the aforementioned step. The flow rate of the DER in the thermal CVD step is, for example, set as 0.01 to 0.2 g/minute, and the flow rate of the oxygen gas is, for example, set as 1 to 1,000 scam.

Thereafter, by closing the opening/closing valves 6 and 23 and opening the opening/closing valve 24, the residual gas inside of the processing chamber 5 is exhausted by using the exhaust tube 9 while supplying the nitrogen gas into the processing chamber 5, thereby replacing the atmosphere in the processing chamber with the nitrogen gas. The silicon substrate 1 is thereafter unloaded from the processing chamber 5 after the ruthenium thin film is formed, and the substrate processing step is completed (END).

The total film thickness of the ruthenium film is, for example, 5 to 15 nm, after the thermal CVD step is performed including the step of repeating the cycles of the steps 1 to 6.

Example 3

In the example 3 as well, by using the manufacturing method of the semiconductor device according to the present invention, the method of forming the lower electrode film and the upper electrode film of the DRAM capacitor will be described.

In example 3, The example 3 is different from the example 1 in the point that the film is formed by the ALD method in which the DER gas and the reaction gas are alternately supplied without using the oxygen gas in the initial stage, and the film is formed by the same method as that of the example 1, from the halfway point. The other conditions are substantially the same as example 1.

(1) The Structure of the Dram Capacitor and the Structure of the Substrate Processing Apparatus These structures are the same as example 1.

(2) The Method of Forming the Ruthenium Film

The method of forming the lower electrode film and the upper electrode film in example 3 will be described with reference to FIG. 3. In the description below, the operation of each component constituting the substrate processing apparatus is controlled by the controller 60. Before the silicon substrate 1 is loaded into the processing chamber 5, the inside of the processing chamber 5 is previously filled with the nitrogen gas, and the atmosphere in the processing chamber 5 is replaced with the inert gas such as the nitrogen.

First, the silicon substrate 1, with the $SiO_2$ film formed on the surface, is loaded into the aforementioned processing chamber 5, the silicon substrate 1 is placed on the susceptor 41 by elevating the heater unit 40, and the silicon substrate 1 is elevated to the film formation position. Then, by closing the opening/closing valves 6, 10, 16, 14, and 23 and opening the opening/closing valves 24 and 13, the residual gas inside of the processing chamber 5 is exhausted by the exhaust tube 9 while supplying the nitrogen gas into the processing chamber 5, thereby filing the inside of the processing chamber 5 with the nitrogen gas. Then, the silicon substrate 1 is heated by the heater 4 to a prescribed temperature, and the pressure of inside the processing chamber 5 is stabilized at a desired value (START). Specifically, the surface temperature of the silicon substrate 1 is set to 200 to 350° C., and the pressure inside the processing chamber is set to 0.1 torr to several tens of Torrs (13.3 Pa to several thousand pascals).

Next, by closing the opening/closing valve 24 and opening the opening/closing valve 6, the DER gas as the source gas is exhausted by the exhaust tube 9 while supplying it into the processing chamber 5 through the diffusion plate 7 and the shower plate 8 (Step 1). Specifically, the flow rate of the DER is set to 0.01 to 0.2 g/minute, and the supply time per one cycle is set to 1 to 60 seconds. As a result, the DER gas molecule is physically adsorbed on the silicon substrate 1.

Subsequently, by closing the opening/closing valve 6 and opening the opening/closing valve 10, the residual gas inside of the processing chamber 5 is exhausted by using the exhaust tube 9 while supplying the nitrogen gas into the processing chamber 5, thereby replacing the atmosphere inside of the processing chamber with the nitrogen gas (Step 2).

In the meantime, by opening the opening/closing valve 12, the processing chamber 5 is bypassed and the inside of the processing chamber 5 is exhausted, while supplying the argon gas and the ammonia gas to the plasma generator 11 and exciting these gases, thereby generating the reaction gas. Also in the meantime, by opening the opening/closing valve 13, the nitrogen gas is supplied into the reaction gas supply line 29 via the adsorption auxiliary gas supply line 30, and the DER gas is prevented from flowing back (entering) into the plasma generator 11.

Next, by closing the opening/closing valves 10, 12, and 13 and opening the opening/closing valve 14, the reaction gas inside of the processing chamber 5 is exhausted by using the exhaust tube 9 while supplying it into the processing chamber 5 (Step 3). Specifically the flow rate of the reaction gas is set to 10 to 5,000 scam, and the supply time per one cycle is set to 1 to 60 seconds. As a result, a portion of the DER gas molecule physically adsorbed on the silicon substrate 1 decomposes and the ruthenium (Ru) atom is chemically adsorbed on the $SiO_2$ film on the silicon substrate 1.

Subsequently, by closing the opening/closing valve 14 and opening the opening/closing valve 13, the residual gas inside of the processing chamber 5 is exhausted by using the exhaust tube 9 while supplying the nitrogen gas into the processing chamber 5, thereby replacing the atmosphere inside of the processing chamber 5 with the nitrogen gas (Step 4).

By setting the steps 1 to 4 as one cycle, and this cycle is repeated a plurality of times until the ruthenium thin film of a desired film thickness is formed on the silicon substrate 1. Such a step is called an initial film formation step. The number of cycles in the initial film formation step is repeated until the film thickness of 1 to 10 nm is achieved in the ruthenium thin film.

Next, subsequently, the ruthenium thin film of a desired film thickness is formed on the ruthenium thin film formed by the initial film formation step, by the same method as that of the example 1. Such a step is called the initial film formation step. In this ( 別に main ではない ) film formation step, the flow rate of the oxygen gas is, for example, set to 10 to 5,000 scam, and the supply time per one cycle is set to 1 to 60 seconds. Other conditions are the same as the conditions of the initial film formation step.

The number of cycles in this film formation step is repeated until the film thickness of the ruthenium film in this film formation step achieves the thickness of 5 to 15 nm, and the total film thickness in the initial film formation step and this film formation step achieves the thickness of 6 to 25 nm.

Thereafter, by closing the opening/closing valves 6, 14, and 23 and opening the opening/closing valve 24, the residual gas inside of the processing chamber 5 is exhausted by using the exhaust tube 9 while supplying the nitrogen gas into the processing chamber 5, thereby replacing the atmosphere inside of the processing chamber 5 with the nitrogen gas. After the ruthenium thin film is formed, the silicon substrate 1 is unloaded from the processing chamber 5, and the substrate processing process is completed (END).

Any of the methods described in examples 1 to 3 above may be used to form the lower electrode film 104. However, when the methods described in examples 1 and 2 are used, it to possible to consider such a case that the barrier metal film 102 as a base is oxidized during film formation of the ruthenium thin film, and a contact resistance is increased. For example, when the barrier metal film 102 is a TiN film, it is also possible to consider such a case that the TiN film is oxidized by oxygen used in the film formation of the ruthenium film to form the insulating film such as a $TiO_2$, and the contact resistance is increased. Meanwhile, by using the method of the example 3, no reaction occurs between the barrier metal film 102 and the oxygen, because the oxygen is not used in the film formation initial stage, thus making it possible to prevent the oxidization of the barrier metal film 102 and prevent an increase of the contact resistance, and this is preferable.

Preferred Embodiments of the Present Invention

A first aspect is a manufacturing method of a semiconductor device, comprising:
loading a substrate into a processing chamber;
forming a thin film having a desired thickness on the substrate by setting as one cycle the step of supplying into the processing chamber adsorption auxiliary gas for aiding an adsorption of a source gas vaporized from a liquid source on said substrate and causing this adsorption auxiliary gas to be adsorbed on the substrate, the step of supplying the source gas into the processing chamber, causing this source gas to react with the adsorption auxiliary gas on the substrate, and causing this source gas to be adsorbed on the substrate, and the step of supplying a reaction gas into the processing chamber and causing this reaction gas to react with the source gas adsorbed on the substrate, and repeating this cycle a plurality of times; and
unloading the substrate provided with the thin film from the inside of the processing chamber.

According to the first aspect, the adsorption auxiliary gas for aiding the adsorption of the source gas on the substrate is previously supplied into the processing chamber and is adsorbed on the substrate, before supplying the source gas into the processing chamber. Therefore, the adsorption of the source gas on the substrate surface can be promoted. Also, the occurrence of the incubation time can be reduced because a surface reaction occurs, with the source gas adsorbed on the surface of the substrate in the initial stage of the film formation. Therefore, the film formation rate can be increased and the productivity can be improved.

Also, according to the first aspect, the adsorption auxiliary gas, the source gas, and the reaction gas are sequentially supplied into the processing chamber. Therefore, the reaction of the gas in the processing chamber is suppressed, and the film formation with good step coverage is possible.

In addition, in the first aspect, impurities can be prevented from remaining in the thin film to be formed, the electrical characteristics of the thin film can be improved, and the bonding characteristics of the thin film to the substrate can be enhanced when the reaction gas has a cleaning action. Further, when the substrate surface is cleaned, the source gas is hardly adsorbed on the substrate surface. However, the adsorption auxiliary gas is supplied and is adsorbed on the substrate before the source gas is supplied into the processing chamber. Therefore, a condition of the substrate surface can be changed to a condition easily allowing the source gas to be adsorbed thereon.

The second aspect is the manufacturing method of the semiconductor device according to the first aspect, wherein said adsorption auxiliary gas is a gas for decomposing a ligand of the source gas.

According to the second aspect, a gas that decomposes the ligands of the source gas is used as the adsorption auxiliary gas. Therefore, decomposition of the source gas on the substrate is promoted, adsorption of the source gas to the substrate surface is thereby facilitated, and the film formation rate can be improved.

The third aspect is the manufacturing method of the semiconductor device according to the first aspect, wherein the adsorption auxiliary gas is a gas containing oxygen atoms.

According to the third aspect, the gas containing oxygen atoms is used as the adsorption auxiliary gas, whereby decomposition of the source gas on the substrate is promoted, adsorption of the source gas on the substrate surface is thereby facilitated, and the film formation rate can be improved.

The fourth aspect is the manufacturing method of the semiconductor device according to the first aspect, wherein the adsorption auxiliary gas is oxygen gas, water vapor, or a hydroxyl radical.

According to the fourth aspect, oxygen gas, water vapor, or a hydroxyl radical is used as the adsorption auxiliary gas, whereby decomposition of the source gas on the substrate is promoted, adsorption of the source gas onto the substrate surface is thereby facilitated, and the film formation rate can be improved.

The fifth aspect is the manufacturing method of the semiconductor device according to the first aspect, wherein the reaction gas is a gas that reacts with the source gas adsorbed on the substrate to form a thin film, and cleans the surface of the substrate.

According to the fifth aspect, by using the gas for cleaning the surface of the substrate, as the reaction gas, impurities can be prevented from remaining in the thin film to be formed, the electrical characteristics of the thin film can be improved, and the bonding characteristics of the thin film to the substrate can be enhanced. In addition, by cleaning the substrate surface, the source gas is hardly adsorbed on the substrate surface. However, the adsorption auxiliary gas is supplied and is adsorbed on the substrate before supplying the source gas into the processing chamber, and therefore the condition of the substrate surface can be changed to the condition easily allowing the source gas to be adsorbed thereon before supplying the source gas.

The sixth aspect is the manufacturing method of the semiconductor device according to the first aspect, wherein the reaction gas is a gas that reacts with the source gas adsorbed on the substrate to form a thin film and that removes oxygen adsorbed on the substrate, or replaces the oxygen adsorbed on the substrate with a material other than oxygen, or removes carbon adsorbed on the substrate, or removes the source gas itself adsorbed on the substrate.

According to the sixth aspect, by removing the oxygen adsorbed on the substrate, replacing the oxygen adsorbed on the substrate with a substance excluding the oxygen, removing the carbon adsorbed on the substrate, or using the gas for removing the source gas itself adsorbed on the substrate, impurities can be prevented from remaining in the thin film to be formed, the electrical characteristics of the thin film can be improved, and the bonding characteristics of the thin film to the substrate can be enhanced. In addition, by using such a reaction gas, the substrate surface is cleaned and the source gas is hardly adsorbed on the substrate surface. However, the adsorption auxiliary gas is supplied and is adsorbed on the substrate before supplying the source gas into the processing chamber, and therefore the condition of the substrate surface can be changed to the condition easily allowing the source gas to be adsorbed thereon before supplying the source gas.

The seventh aspect is the manufacturing method of the semiconductor device according to the first aspect, wherein the reaction gas is a gas that does not contain oxygen atoms.

According to the seventh aspect, by using the gas not containing the oxygen atom, the impurities can be prevented from remaining in the thin film to be formed, the electrical characteristics of the thin film can be improved, and the bonding characteristics of the thin film to the substrate can be enhanced. In addition, by using the gas not containing the oxygen atom as the reaction gas, the source gas is hardly adsorbed on the substrate surface. However, the adsorption auxiliary gas is supplied and is adsorbed on the substrate before supplying the source gas into the processing chamber. Therefore, the condition of the substrate surface can be changed to the condition easily allowing the source gas to be adsorbed thereon, before supplying the source gas.

The eighth aspect is the manufacturing method of the semiconductor device according to the first aspect, wherein said reaction gas is a gas obtained by activating a gas containing hydrogen atoms, a gas containing nitrogen atoms, and argon gas by plasma.

According to the eighth aspect, by using the gas obtained by activating the gas containing the hydrogen atoms, the gas containing the nitrogen atoms, and the argon gas by plasma, the impurities can be prevented from remaining in the thin film to be formed, the electrical characteristics of the thin film can be improved, and the bonding characteristics of the thin film to the substrate can be enhanced. In addition, by using such a reaction gas, the substrate surface is cleaned and the source gas is hardly adsorbed on the substrate surface. However, the adsorption auxiliary gas is supplied and is adsorbed on the substrate before supplying the source gas into the processing chamber. Therefore, the condition of the substrate surface can be changed to the condition easily allowing the source gas to be adsorbed thereon before supplying the source gas.

The ninth aspect is the manufacturing method of the semiconductor device according to first aspect, wherein the reaction gas is a gas obtained by activating hydrogen gas or ammonia gas by plasma.

According to the ninth aspect, by using the gas obtained by activating the hydrogen gas or the ammonia gas by plasma, the impurities can be prevented from remaining in the thin film to be formed, the electrical characteristics of the thin film can be improved, and the bonding characteristics of the thin film to the substrate can be enhanced. In addition by using such a reaction gas, the substrate surface is cleaned and the source gas is hardly adsorbed on the substrate surface. However, the adsorption auxiliary gas is supplied and is adsorbed on the substrate before supplying the source gas into the processing chamber. Therefore, the condition of the substrate surface can be changed to the condition easily allowing the source gas to be adsorbed thereon before supplying the source gas.

The tenth aspect is the manufacturing method of the semiconductor device according to the first aspect, wherein in the step of forming the thin film, a thin film having a desired thickness is formed on the substrate by a thermal CVD method by simultaneously supplying the source gas and a gas containing oxygen atoms into the processing chamber after repeating the cycle a plurality of times.

According to the tenth aspect, by using the manufacturing method of the semiconductor device according to the first invention to form the film as a base, before forming the thin film by using the thermal CVD method, the occurrence of incubation time can be reduced. Also, by forming the thin film by using the thermal CVD method from the halfway point, the film formation rate can furthermore be increased and productivity can be improved.

The eleventh aspect is the manufacturing method of the semiconductor device according to the first aspect, wherein the liquid source is a liquid source containing ruthenium atoms, and the thin film formed thereby is a film containing ruthenium atoms.

According to the eleventh aspect, when the liquid source is a liquid source containing the ruthenium atoms and the thin film to be formed is a thin film containing the ruthenium atoms, particularly, there is a problem that the source gas is hardly adsorbed on the substrate surface. However, the adsorption auxiliary gas is supplied and is adsorbed on the substrate before supplying the source gas into the processing chamber. Therefore, the condition of the substrate surface can be changed to the condition easily allowing the source gas to be adsorbed thereon before supplying the source gas.

The twelfth aspect is a manufacturing method of the semiconductor device, comprising the steps of loading a substrate into a processing chamber; forming a thin film having a desired thickness on the substrate by setting as one cycle the step of supplying into the processing chamber a ligand-decomposing gas that decomposes the ligand of a source gas vaporized from a liquid source, and causing this ligand-decomposing gas to be adsorbed on the substrate, the step of supplying the source gas into the processing chamber, causing this source gas to react with the ligand-decomposing gas on the substrate, and causing this source gas to be adsorbed on the substrate, and the step of supplying a reaction gas into the processing chamber, and causing the reaction gas to react with the source gas adsorbed on the substrate, and repeating this cycle a plurality of times; and unloading the substrate provided with the thin film from the inside of the processing chamber.

According to the twelfth aspect, the gas that decomposes the ligands of the source gas is supplied and adsorbed on the substrate before the source gas is supplied into the processing chamber, and the decomposition of the source gas on the substrate is therefore promoted, adsorption of source gas onto the substrate surface is thereby facilitated, and the film formation rate can be increased.

The thirteenth aspect is a manufacturing method of the semiconductor device, comprising the steps of loading a substrate into a processing chamber; forming a thin film having a desired thickness on the substrate by setting as one cycle the step of supplying into the processing chamber a gas containing oxygen atoms, and causing this gas to be adsorbed on the substrate, the step of supplying into the processing chamber a source gas vaporized from a liquid source, causing the source gas to react with the containing oxygen atoms on the substrate, and causing the source gas to be adsorbed on the substrate, and the step of supplying into the processing chamber a reaction gas not containing oxygen atoms and causing this reaction gas to react with the source gas adsorbed on the substrate, and repeating this cycle a plurality of times; and unloading the substrate provided with the thin film from the inside of the processing chamber.

According to the thirteenth aspect, the gas containing the oxygen atoms is supplied and is adsorbed on the substrate before the source gas is supplied into the processing chamber, and the decomposition of the source gas on the substrate is therefore promoted when the source gas is supplied, adsorption of the source gas on the substrate surface is thereby facilitated, and the film formation rate can be increased.

The fourteenth aspect is a manufacturing method of the semiconductor device, comprising the steps of loading a substrate into a processing chamber; forming a thin film having a desired thickness as an initial film on the substrate by setting as one cycle the step of supplying into the processing chamber a source gas vaporized from a liquid source and causing this source gas to be adsorbed on the substrate, the step of supplying a reaction gas to react with the source gas adsorbed on the substrate, and repeating this cycle a plurality of times, forming a thin film having a desired thickness on said thin film having the desired thickness formed in said initial film forming step, by setting as one cycle the step of supplying into the processing chamber an adsorption auxiliary gas for aiding adsorption of the source gas on the substrate and causing this adsorption auxiliary gas to be adsorbed on the substrate, the step of supplying the source gas into the processing chamber, and causing this source gas to react with the adsorption auxiliary gas on the substrate, and causing this source gas to be adsorbed on the substrate, and the step of supplying the reaction gas into the processing chamber and causing this reaction gas to react with the source gas adsorbed on the substrate, and repeating this cycle a plurality of times; and unloading the substrate provided with the thin film from the inside of the processing chamber.

In the initial film formation step, a reaction between the adsorption auxiliary gas and the base that forms the thin film can be prevented because the adsorption auxiliary gas for aiding adsorption on the substrate of the source gas is not supplied into the processing chamber. Also, in this film formation step, the adsorption auxiliary gas is previously supplied into the processing chamber and is adsorbed on the substrate surface before the source gas is supplied into the processing chamber, whereby the adsorption of source gas on the substrate surface is promoted, the film formation rate is increased, and productivity can be improved.

The fifteenth aspect is a substrate processing apparatus, comprising a processing chamber for processing a substrate; a source gas supply line for supplying into the processing chamber a source gas vaporized from a liquid source; a reaction gas supply line for supplying into the processing chamber a reaction gas that reacts with the source gas; an adsorption auxiliary gas supply line for supplying into the processing chamber an adsorption auxiliary gas for aiding adsorption on the substrate of the source gas; and a controller for carrying out control for forming a thin film having a desired thickness on the substrate by setting as one cycle the step of supplying the adsorption auxiliary gas into the processing chamber and causing this adsorption auxiliary gas to be adsorbed on the substrate, the step of supplying the source gas into the processing chamber and causing this source gas to react with the adsorption auxiliary gas on the substrate and causing this source gas to be adsorbed on the substrate, and the step of supplying the reaction gas into the processing chamber and causing this reaction gas to react with the source gas adsorbed on the substrate, and repeating this cycle a plurality of times.

The controller performs control so that the adsorption auxiliary gas, the source gas, and the reaction gas are sequentially supplied into the processing chamber. This makes it possible to automate the manufacturing method of the semiconductor device of the first aspect, thus further facilitating a work.

After the controller has performed control so that the adsorption auxiliary gas, the source gas, and the reaction gas are sequentially supplied into the processing chamber, the gas containing the source gas and the oxygen atoms are simultaneously supplied. This makes it possible to automate the manufacturing method of the semiconductor device of the tenth aspect, thus further facilitating the work.

After the controller has performed control so that the adsorption auxiliary gas, the source gas, and the reaction gas are sequentially supplied into the processing chamber, the adsorption auxiliary gas, the source gas, and the reaction gas are sequentially supplied into the processing chamber. This makes it possible to automate the manufacturing method of the semiconductor device of the fourteenth aspect, thus further facilitating the work in this case also.

KEY

Figure 1:
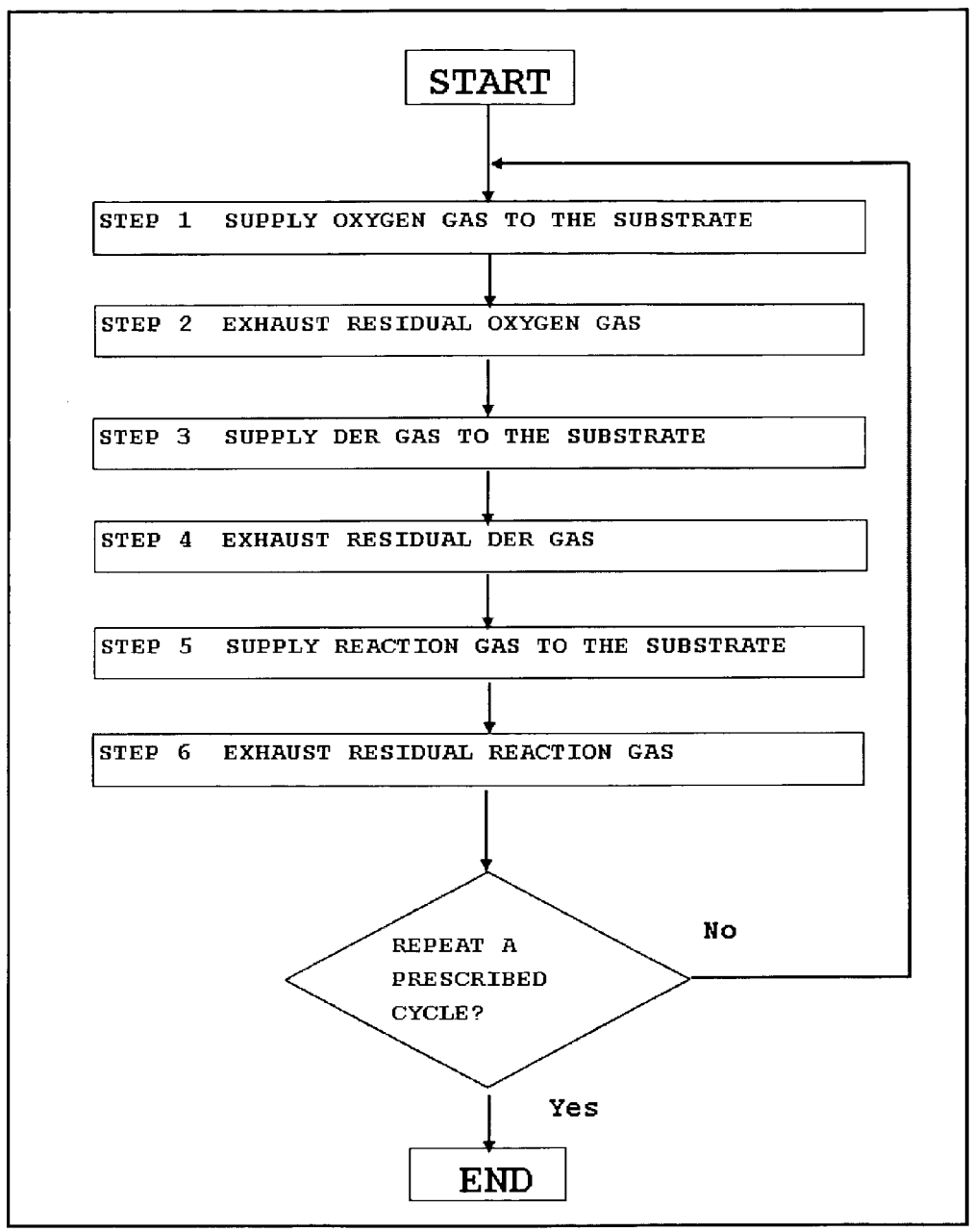
FIG. 1 is a view showing a substrate processing step as a step of a manufacturing method of a semiconductor device according to example 1.
Figure 2:
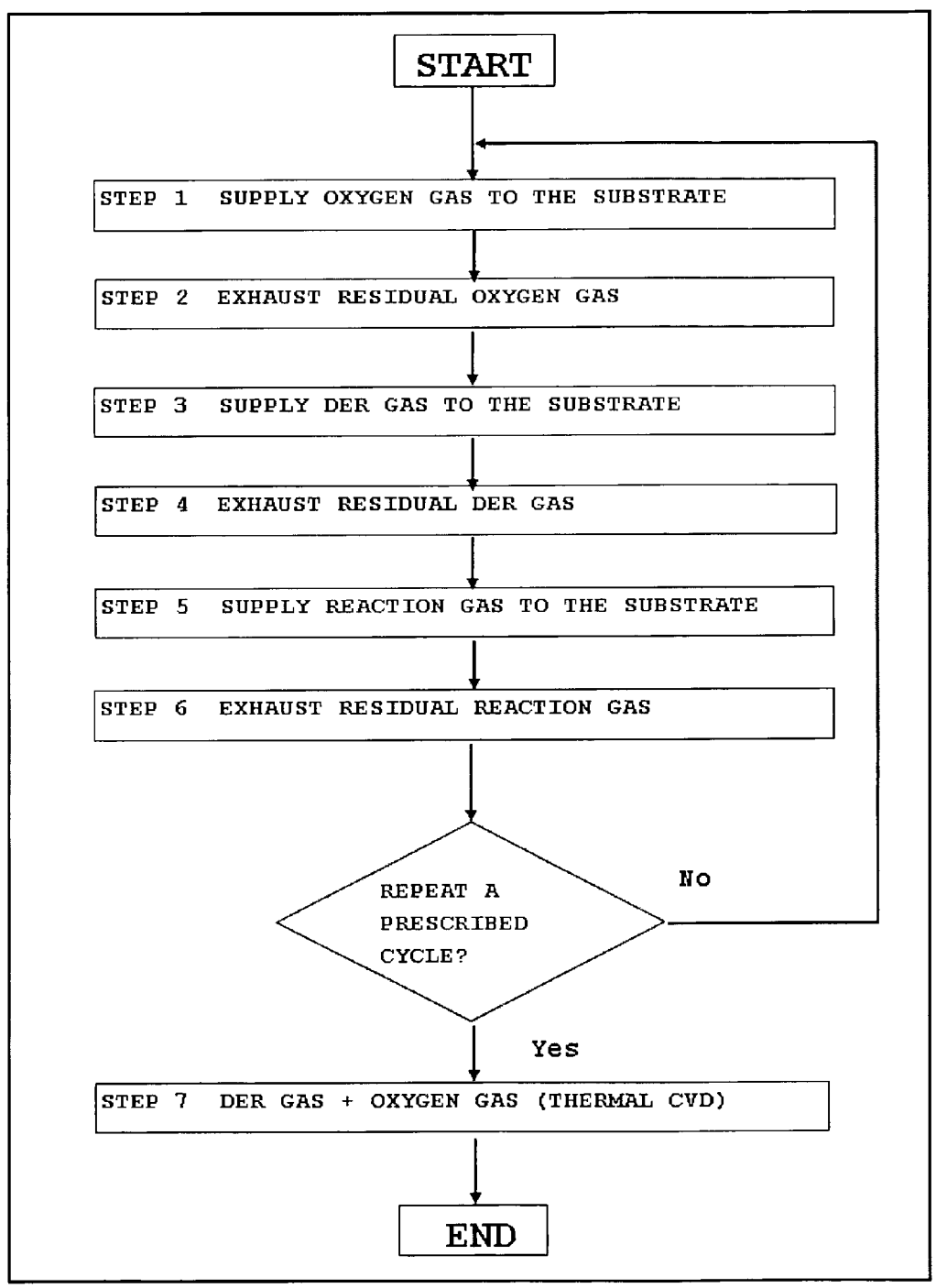
FIG. 2 is a view showing the substrate processing step as a step of the manufacturing steps of the semiconductor device according to example 2.
Figure 3:
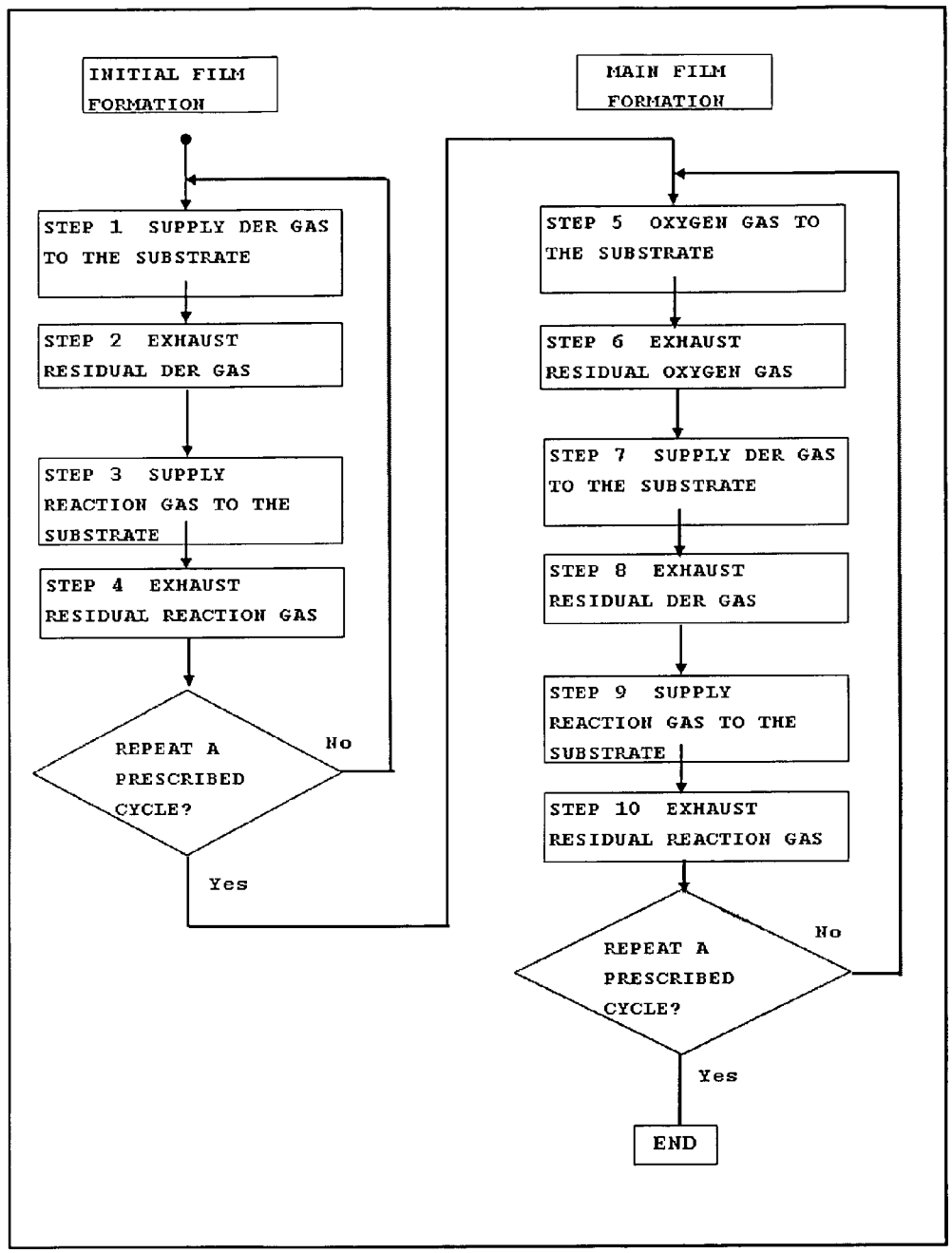
FIG. 3 is a view showing a substrate processing step as a step of the manufacturing steps of the semiconductor device according to example 3.
Figure 4:
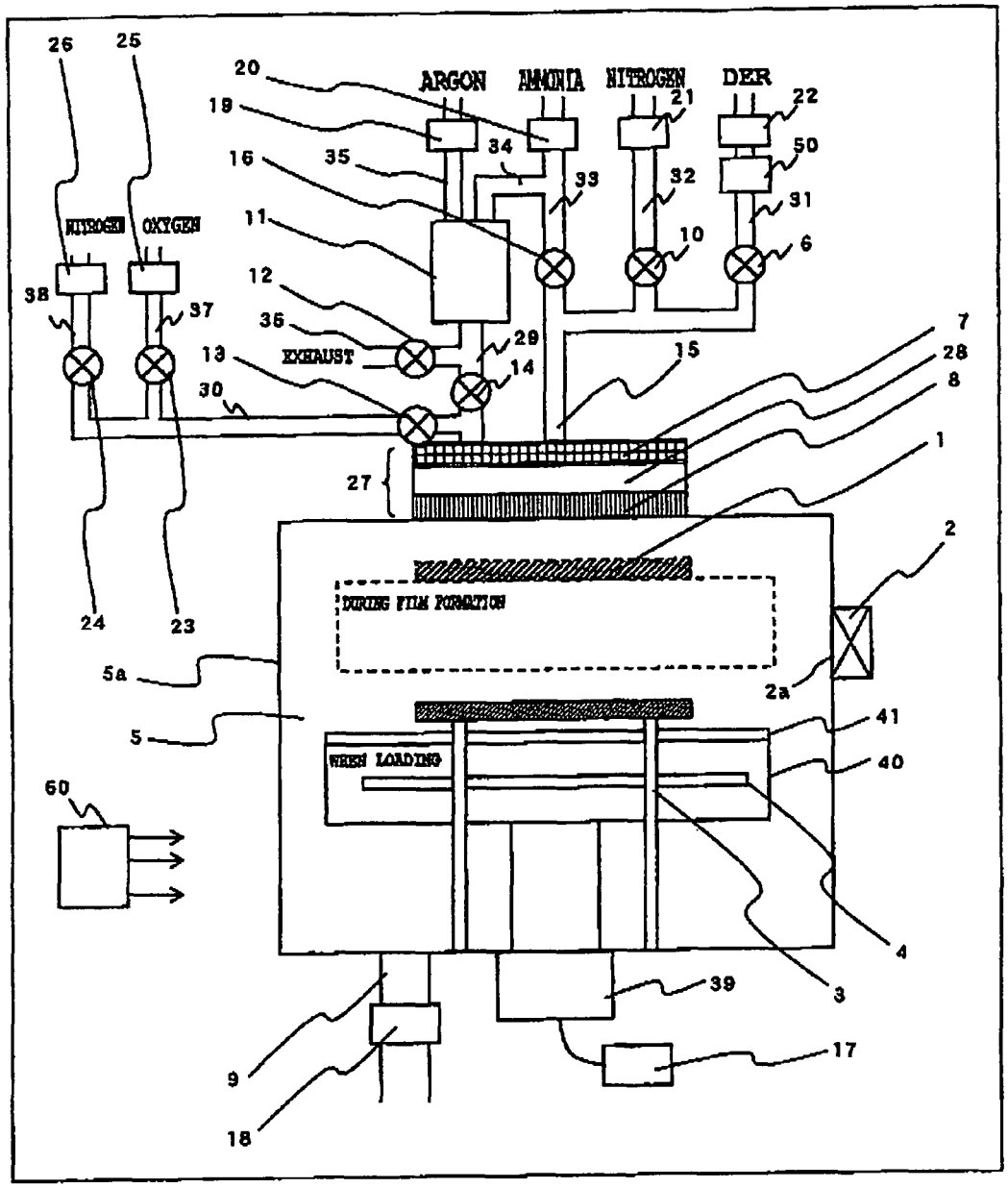
FIG. 4 is a schematic view showing a structure example of the substrate processing apparatus according to an example of the present invention used in each of the examples 1 through 3.
Figure 5:
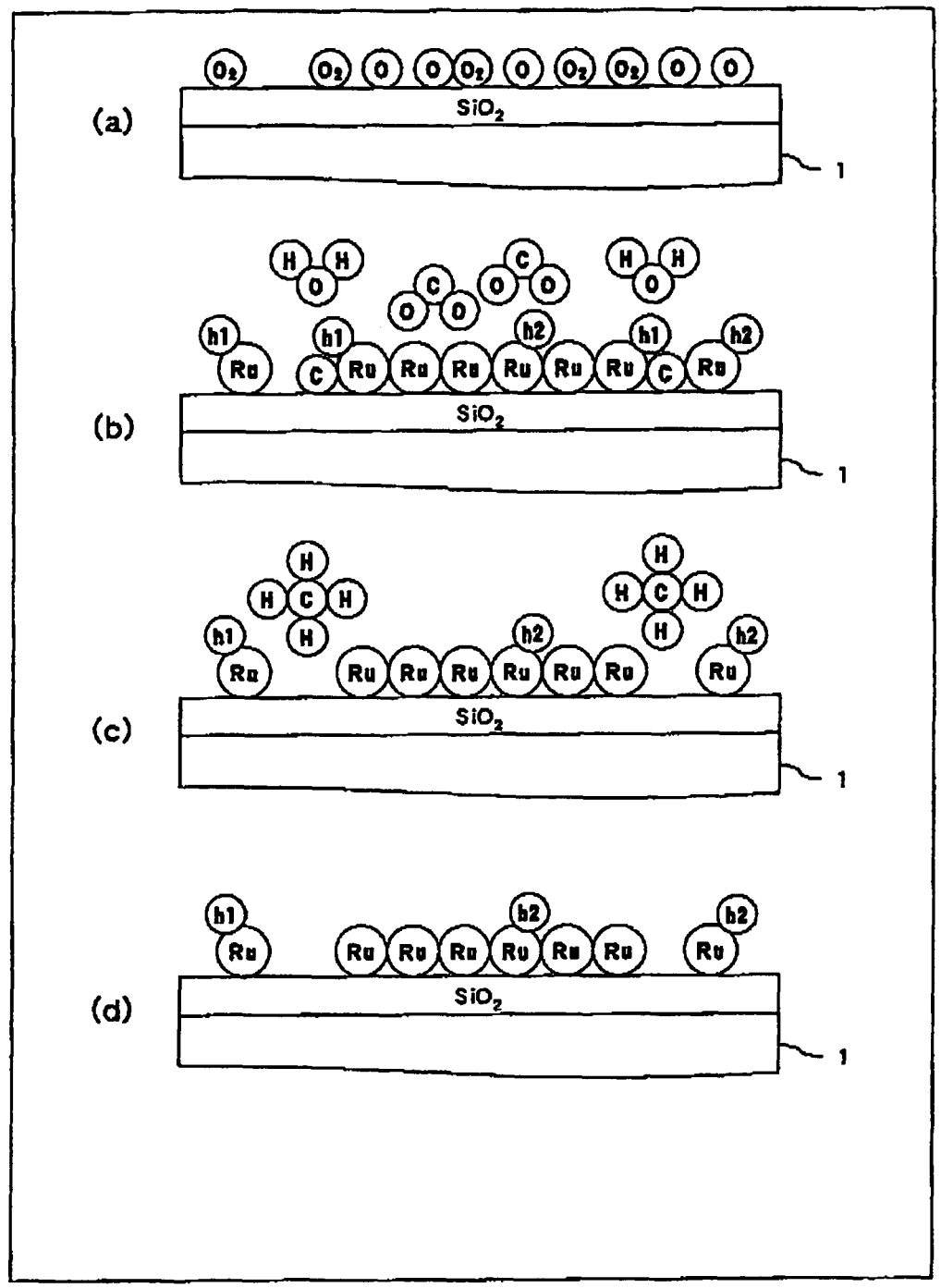
FIG. 5 is a view exemplifying a film formation mechanism when an embodiment of the present invention is implemented, wherein (a) shows a state in which adsorption auxiliary gas for aiding adsorption of a source gas is supplied and adsorbed on the substrate surface; (b) shows a state in which the source gas is supplied to the substrate surface, reacted with the adsorption auxiliary gas, and adsorbed onto the substrate; (a) shows a state in which the reaction gas is supplied to the substrate surface and reacted with the source gas; and (d) shows a state of the substrate surface after one cycle is completed.
Figure 6:
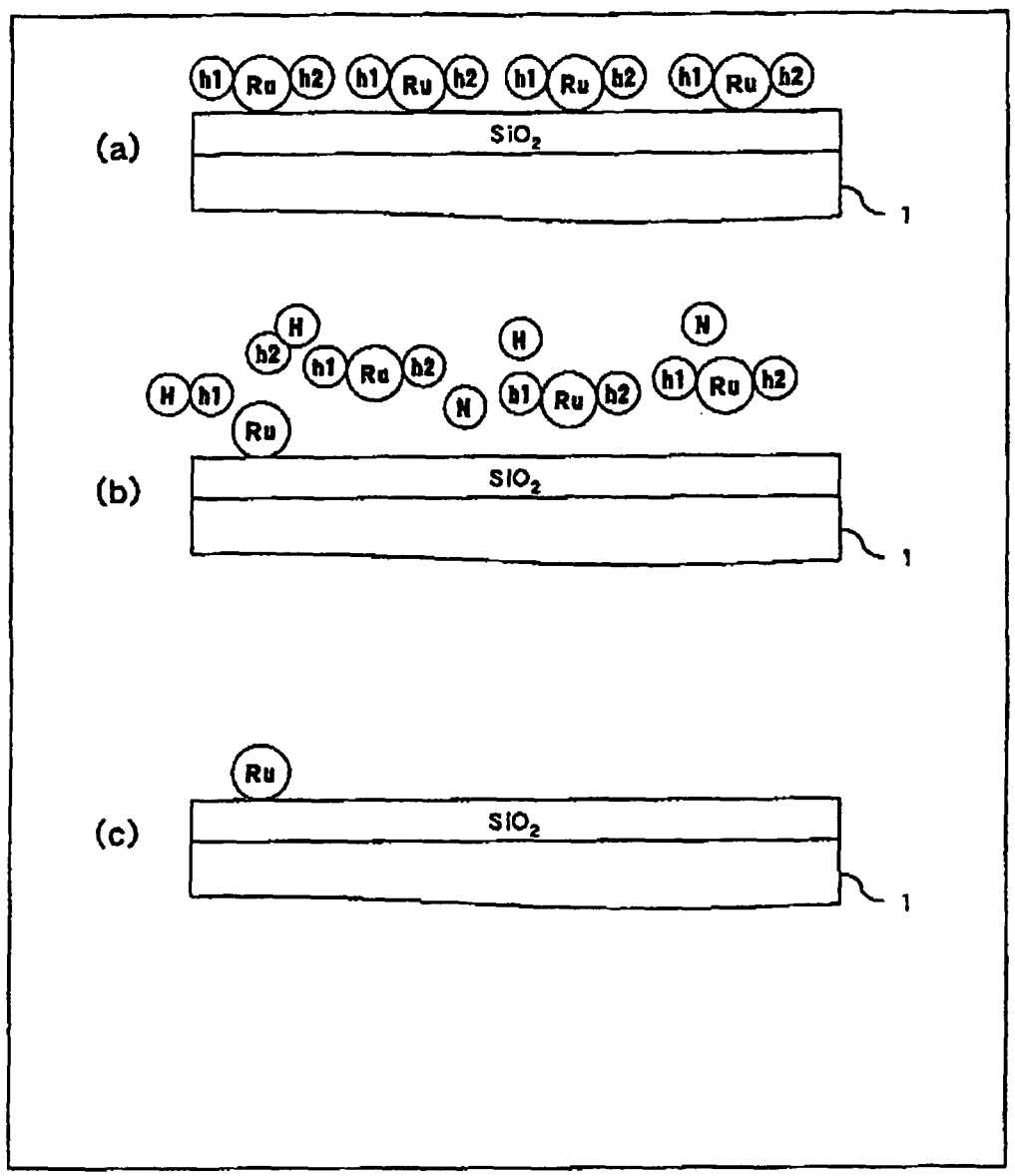
FIG. 6 is a view exemplifying the film formation mechanism when a conventional ALD method is implemented, wherein (a) shows a state in which the source gas is supplied and adsorbed on the substrate surface; (b) shows a state in which the reaction gas is supplied to the substrate surface and reacted with the source gas to form a film; and (c) shows a state of a thin film generated on the substrate surface in one cycle.
Figure 7:
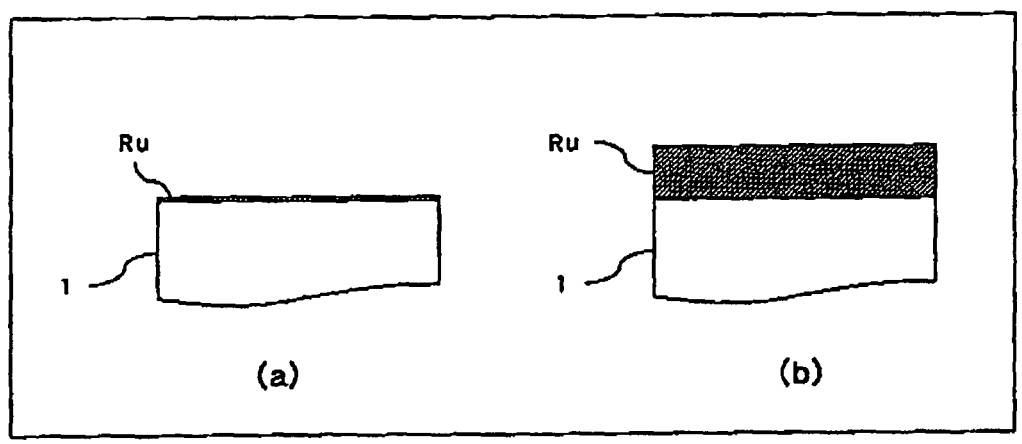
FIG. 7 is a view showing a difference in film formation rates between the conventional ALD and an embodiment of the present invention, wherein (a) is a view showing a state of film formation by the conventional ALD method, and (b) is a view showing a state of film formation by the embodiment of the present invention.
Figure 8:
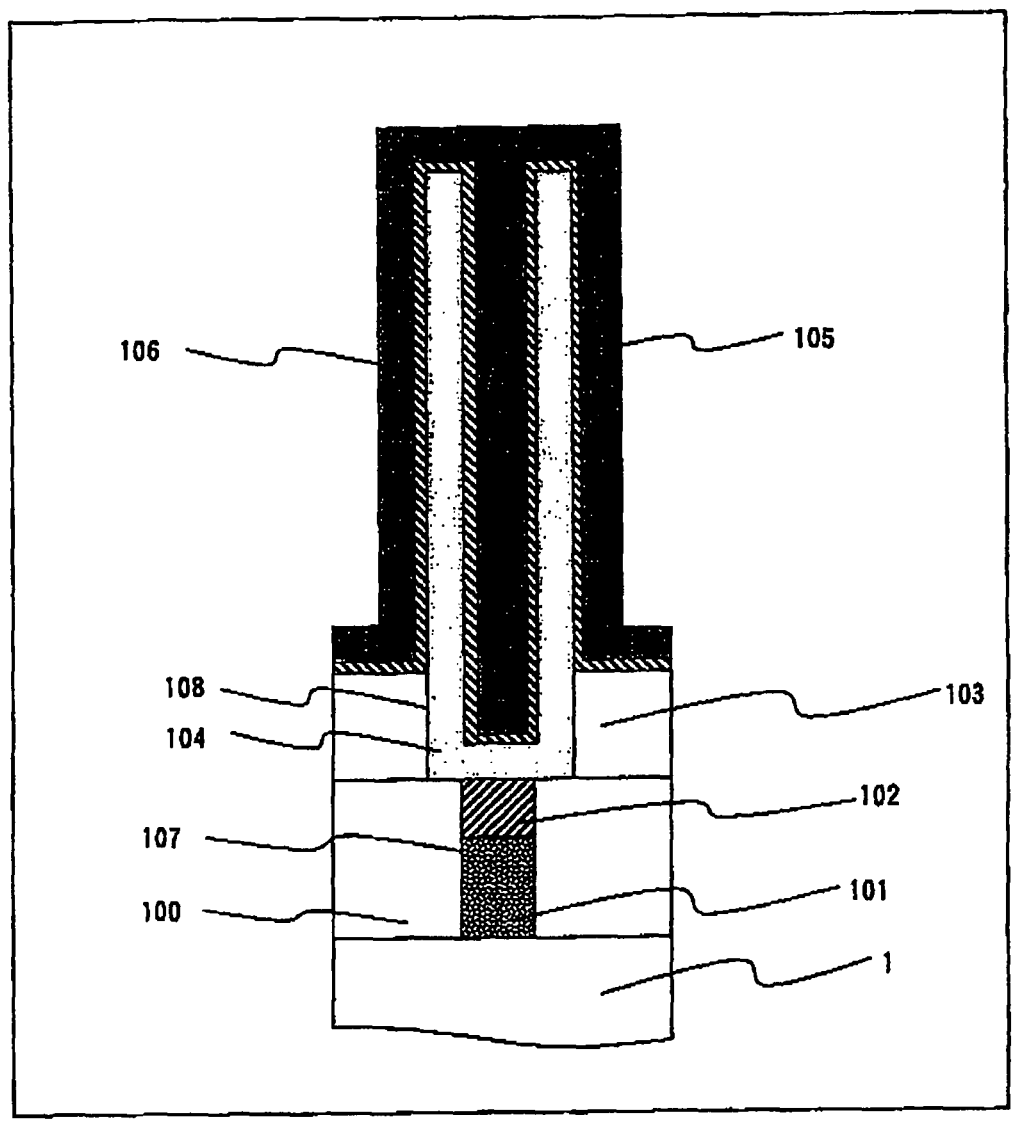
FIG. 8 is a cross-sectional view of a DRAM capacitor portion provided with a lower electrode film and an upper electrode film formed in examples 1 through 3.

1 Silicon substrate
5 Processing chamber
15 Source gas supply line
29 Reaction gas supply line
30 Adsorption auxiliary gas supply line
60 Controller
Ru Ruthenium atoms
h1 Ligand
h2 Ligand

The invention claimed is:

1. A manufacturing method of a semiconductor device, comprising:
    loading a substrate into a processing chamber;
    forming a thin film having a desired thickness on said substrate by setting the following (a), (b), and (c) sequentially as one cycle:
        (a) supplying into said processing chamber an adsorption auxiliary gas for aiding an adsorption of a source gas vaporized from a liquid source on said substrate by reacting with a ligand of said source gas and decomposing said ligand, and causing said adsorption auxiliary gas to be adsorbed on said substrate;
        (b) supplying said source gas into said processing chamber, causing said ligand of said source gas to react with said adsorption auxiliary gas adsorbed on said substrate and be decomposed, causing said adsorption auxiliary gas to be removed from said substrate, and causing said source gas to be adsorbed on said substrate; and
        (c) supplying a reaction gas into said processing chamber and causing this reaction gas to react with said source gas adsorbed on said substrate,
    the cycle being repeated a plurality of times; and
    unloading said substrate provided with said thin film from the inside of said processing chamber.

2. The manufacturing method of the semiconductor device according to claim 1, wherein said adsorption auxiliary gas is a gas containing oxygen atoms.

3. The manufacturing method of the semiconductor device according to claim 1, wherein said adsorption auxiliary gas is oxygen gas, water vapor, or a hydroxyl radical.

4. The manufacturing method of the semiconductor device according to claim 1, wherein said reaction gas is a gas that reacts with said source gas adsorbed on said substrate to form a thin film, and cleans the surface of said substrate.

5. The manufacturing method of the semiconductor device according to claim 1, wherein said reaction gas is a gas that reacts with said source gas adsorbed on said substrate to form a thin film, and removes oxygen adsorbed on said substrate, or replaces the oxygen adsorbed on said substrate with a material other than the oxygen, or removes carbon adsorbed on said substrate, or removes said source gas itself adsorbed on said substrate.

6. The manufacturing method of the semiconductor device according to claim 1, wherein said reaction gas is a gas not containing oxygen atoms.

7. The manufacturing method of the semiconductor device according to claim 1, wherein said reaction gas is a gas obtained by activating a gas containing hydrogen atoms, a gas containing nitrogen atoms, and argon gas by plasma.

8. The manufacturing method of the semiconductor device according to claim 1, wherein said reaction gas is a gas obtained by activating hydrogen gas or ammonia gas by plasma.

9. The manufacturing method of the semiconductor device according to claim 1, wherein in forming the thin film, the thin film having a desired thickness is formed on said substrate by a thermal CVD method by simultaneously supplying said source gas and a gas containing oxygen atoms into said processing chamber after repeating said cycle a plurality of times.

10. The manufacturing method of the semiconductor device according to claim 1, wherein said liquid source is a liquid source containing ruthenium atoms, and said thin film formed thereby is a film containing ruthenium atoms.

11. A manufacturing method of a semiconductor device, comprising:
- loading a substrate into a processing chamber;
- forming a thin film having a desired thickness on said substrate by setting the following (a), (b), and (c) sequentially as one cycle:
  - (a) supplying into said processing chamber a gas containing oxygen atoms and for aiding adsorption of a source gas vaporized from a liquid source by reacting with a ligand of said source gas and decomposing said ligand, and causing said gas containing oxygen atoms to be adsorbed on said substrate;
  - (b) supplying into said processing chamber said source gas, causing said ligand of said source gas to react with said gas containing oxygen atoms adsorbed on said substrate and be decomposed, causing said gas containing oxygen atoms to be removed from said substrate, and causing this source gas to be adsorbed on said substrate; and
  - (c) supplying into said processing chamber a reaction gas not containing oxygen atoms and causing this reaction gas to react with said source gas adsorbed on said substrate,
  - the cycle being repeated a plurality of times; and
- unloading said substrate provided with said thin film from the inside of said processing chamber.

12. A manufacturing method of a semiconductor device, comprising:
- loading a substrate into a processing chamber;
- forming a thin film having a prescribed thickness as an initial film on said substrate by setting the following (a) and (b) sequentially as a first cycle:
  - (a) supplying into said processing chamber a source gas vaporized from a liquid source and causing this source gas to be adsorbed on said substrate; and
  - (b) supplying a reaction gas into said processing chamber and causing this reaction gas to react with said source gas adsorbed on said substrate;
  - the first cycle being repeated a plurality of times;
- forming a thin film having a desired thickness on said thin film having the prescribed thickness formed in forming the thin film having a prescribed thickness as the initial film, by setting the following (c), (d), and (e) sequentially as a second cycle:
  - (c) supplying into said processing chamber an adsorption auxiliary gas for aiding an adsorption of said source gas on said substrate by reacting with a ligand of said source gas and decomposing said ligand, and causing said adsorption auxiliary gas to be adsorbed on said substrate;
  - (d) supplying said source gas into said processing chamber, causing said ligand of said source gas to react with said adsorption auxiliary gas adsorbed on said substrate and be decomposed, causing said adsorption auxiliary gas to be removed from said substrate, and causing said source gas to be adsorbed on said substrate; and
  - (e) supplying said reaction gas into said processing chamber and causing this reaction gas to react with said source gas adsorbed on said substrate, the second cycle being repeated a plurality of times; and
- unloading said substrate provided with said thin film from the inside of said processing chamber.

13. A substrate processing apparatus, comprising:
- a processing chamber in which a substrate is processed;
- a source gas supply line that supplies into said processing chamber a source gas vaporized from a liquid source;
- a reaction gas supply line that supplies into said processing chamber a reaction gas that reacts with said source gas;
- an adsorption auxiliary gas supply line that supplies into said processing chamber an adsorption auxiliary gas for aiding an adsorption of said source gas on said substrate by reacting with a ligand of said source gas and decomposing said ligand; and
- a controller that is configured to carry out control for forming a thin film having a desired thickness on said substrate by setting the following (a), (b), and (c) sequentially as one cycle:
  - (a) supplying said adsorption auxiliary gas into said processing chamber and causing this adsorption auxiliary gas to be adsorbed on said substrate;
  - (b) supplying said source gas into said processing chamber, causing said ligand of said source gas to react with said adsorption auxiliary gas adsorbed on said substrate and be decomposed, causing said adsorption auxiliary gas to be removed from said substrate, and causing said source gas to be adsorbed on said substrate; and
  - (c) supplying said reaction gas into said processing chamber and causing this reaction gas to react with said source gas adsorbed on said substrate, the cycle being repeated a plurality of times.

* * * * *